(12) United States Patent
Venkatachalam Jayaraman et al.

(10) Patent No.: US 9,166,620 B2
(45) Date of Patent: Oct. 20, 2015

(54) METHOD AND APPARATUS FOR A MEMORY BASED PACKET COMPRESSION ENCODING

(71) Applicant: QUALCOMM Incorporated, San Diego, CA (US)

(72) Inventors: Venkata Ramanan Venkatachalam Jayaraman, San Diego, CA (US); Rohit Kapoor, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 227 days.

(21) Appl. No.: 13/960,583

(22) Filed: Aug. 6, 2013

(65) Prior Publication Data

US 2014/0086265 A1 Mar. 27, 2014

Related U.S. Application Data

(60) Provisional application No. 61/705,994, filed on Sep. 26, 2012.

(51) Int. Cl.
  *H03M 7/00* (2006.01)
  *H03M 7/40* (2006.01)
  *H03M 7/30* (2006.01)

(52) U.S. Cl.
  CPC .............. *H03M 7/3086* (2013.01); *H03M 7/40* (2013.01)

(58) Field of Classification Search
  None
  See application file for complete search history.

(56) References Cited

U.S. PATENT DOCUMENTS

| | | | |
|---|---|---|---|
| 5,051,745 A * | 9/1991 | Katz | 341/51 |
| 5,970,177 A | 10/1999 | Chinnock | |
| 5,990,955 A * | 11/1999 | Koz | 375/240.01 |
| 7,554,464 B1 * | 6/2009 | Oberdorfer | 341/55 |
| 2001/0038347 A1 * | 11/2001 | Avery et al. | 341/51 |
| 2005/0210151 A1 | 9/2005 | Abdo et al. | |
| 2007/0036129 A1 * | 2/2007 | Blanton | 370/352 |
| 2007/0109153 A1 | 5/2007 | Ma et al. | |
| 2007/0189278 A1 | 8/2007 | Tu et al. | |
| 2008/0279464 A1 * | 11/2008 | Ahn et al. | 382/244 |
| 2010/0079311 A1 * | 4/2010 | Sluiter | 341/51 |
| 2010/0124239 A1 * | 5/2010 | Hughes | 370/477 |
| 2010/0127902 A1 * | 5/2010 | Schneider | 341/51 |
| 2012/0243551 A1 * | 9/2012 | Afek et al. | 370/412 |

(Continued)

OTHER PUBLICATIONS

International Search Report and Written Opinion—PCT/US2013/060917—ISA/EPO—Nov. 14, 2013.

(Continued)

*Primary Examiner* — Brandon Renner
*Assistant Examiner* — Deepa Belur
(74) *Attorney, Agent, or Firm* — Charles Chesney

(57) ABSTRACT

Methods and apparatus for wireless communication in a mobile device that includes receiving a transmission data packet and detecting a string of bytes in the transmission data packet that matches a preset string of bytes saved in a memory component. Aspects of the methods and apparatus include replacing the string of bytes of the transmission data packet that has been determined to match the preset string of bytes saved in the memory component with a location pointer, wherein after replacing the string of bytes in the data packet with the location pointer, the data packet comprises the location pointer and a set of literal bytes. Aspects of the methods and apparatus also include generating a compressed transmission data packet by entropy coding the transmission data packet comprising the set of literal-bytes and the location pointer.

24 Claims, 10 Drawing Sheets

(56) References Cited

U.S. PATENT DOCUMENTS

2012/0256771 A1* 10/2012 Mitchem et al. ............... 341/87
2013/0039487 A1    2/2013 McGrew
2014/0092987 A1*  4/2014 Singer et al. ............. 375/240.25

OTHER PUBLICATIONS

Co-pending U.S. Appl. No. 14/067,703, filed Oct. 30, 2013.
Co-pending U.S. Appl. No. 14/084,272, filed Nov. 19, 2013.
Co-pending U.S. Appl. No. 14/099,478, filed Dec. 6, 2013.

* cited by examiner

METHOD AND APPARATUS FOR A MEMORY BASED PACKET COMPRESSION ENCODING

CLAIM OF PRIORITY UNDER 35 U.S.C §119

The present application for patent claims priority to U.S. Provisional Application No. 61/705,994 entitled "METHOD AND APPARATUS FOR A MEMORY BASED PACKET COMPRESSION ENCODING" filed Sep. 26, 2012, and assigned to the assignee hereof and hereby expressly incorporated by reference.

BACKGROUND

1. Field

Aspects of the present disclosure relate generally to telecommunication systems, and more particularly, to an apparatus and method for a telecommunication system with a memory based packet coding for compression and decompression, thereby providing consistent service in a wireless communication system.

2. Background

Wireless and wire-line communication networks are widely deployed to provide various communication services such as telephony, video, data, messaging, broadcasts, and so on. Such networks, which are usually multiple access networks, support communications for multiple users by sharing the available network resources. One example of such a network is the UMTS Terrestrial Radio Access Network (UTRAN). The UTRAN is the radio access network (RAN) defined as a part of the Universal Mobile Telecommunications System (UMTS), a third generation (3G) mobile phone technology supported by the 3rd Generation Partnership Project (3GPP). The UMTS, which is the successor to Global System for Mobile Communications (GSM) technologies, currently supports various air interface standards, such as Wideband-Code Division Multiple Access (W-CDMA), Time Division-Code Division Multiple Access (TD-CDMA), and Time Division-Synchronous Code Division Multiple Access (TD-SCDMA). The UMTS also supports enhanced 3G data communications protocols, such as High Speed Packet Access (HSPA), which provides higher data transfer speeds and capacity to associated UMTS networks.

As the demand for mobile broadband access continues to increase, research and development continue to advance the UMTS technologies not only to meet the growing demand for mobile broadband access, but to advance and enhance the user experience with mobile communications in multimode devices.

However, in some multimode devices, packet data traffic between a mobile user equipment (UE) and a corresponding access network may not always be encoded in a format that minimizes the transmission packet size.

Thus, aspects of this an apparatus and method include minimizing transmission packet size via a memory based transmission packet compression encoding for providing consistent service in a wireless communication system.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

A method for minimizing transmission packet size via a memory based transmission packet compression encoding is provided. The method includes receiving a transmission data packet and detecting a string of bytes in the transmission data packet that matches a preset string of bytes saved in a memory component. Additionally, the method includes replacing the string of bytes of the transmission data packet that has been determined to match the preset string of bytes saved in the memory component with a location pointer, wherein after replacing the string of bytes in the data packet with the location pointer, the data packet comprises the location pointer and a set of literal bytes. Further, the method includes generating a compressed transmission data packet by entropy coding the transmission data packet comprising the set of literal-bytes and the location pointer.

In another aspect, an apparatus for minimizing transmission packet size via a memory based transmission packet compression encoding is provided. The apparatus includes a processor configured to receive a transmission data packet and detect a string of bytes in the transmission data packet that matches a preset string of bytes saved in a memory component. Additionally, the processor is configured to replace the string of bytes of the transmission data packet that has been determined to match the preset string of bytes saved in the memory component with a location pointer, wherein after replacing the string of bytes in the data packet with the location pointer, the data packet comprises the location pointer and a set of literal bytes. Further, the processor is configured to generate a compressed transmission data packet by entropy coding the transmission data packet comprising the set of literal-bytes and the location pointer.

In another aspect, an apparatus for minimizing transmission packet size via a memory based transmission packet compression encoding is provided that includes means for receiving a transmission data packet and means for detecting a string of bytes in the transmission data packet that matches a preset string of bytes saved in a memory component. Additionally, the apparatus includes means for replacing the string of bytes of the transmission data packet that has been determined to match the preset string of bytes saved in the memory component with a location pointer, wherein after replacing the string of bytes in the data packet with the location pointer, the data packet comprises the location pointer and a set of literal bytes. Further, the apparatus includes means for generating a compressed transmission data packet by entropy coding the transmission data packet comprising the set of literal-bytes and the location pointer.

In yet another aspect, a computer-readable media for minimizing transmission packet size via a memory based transmission packet compression encoding is provided that includes machine-executable code for receiving a transmission data packet and detecting a string of bytes in the transmission data packet that matches a preset string of bytes saved in a memory component. Additionally, the code may be executable for replacing the string of bytes of the transmission data packet that has been determined to match the preset string of bytes saved in the memory component with a location pointer, wherein after replacing the string of bytes in the data packet with the location pointer, the data packet comprises the location pointer and a set of literal bytes. Further, the code may be executable for generating a compressed transmission data packet by entropy coding the transmission data packet comprising the set of literal-bytes and the location pointer.

These and other aspects of the disclosure will become more fully understood upon a review of the detailed description, which follows.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

As discussed above, packet data traffic between a mobile user equipment (UE) and a corresponding access network may not always be encoded in a format that minimizes the transmission packet size. However, two opportunities exist by which the packet data traffic can be easily identified and compressed that minimizes the transmission packet size of the packet data traffic.

One, there could be redundancy within the transmission packet. Such transmission packets may be compressed further without making use of information from other packets in a flow. Two, there could be redundancy across transmission packets in a flow. In this case, compressing each packet individually might not provide as much gain as when the packets are compressed with additional knowledge of packets that were transmitted previously in the data flow.

Thus, aspects of this apparatus and method are configured to minimize transmission packet size in order to reduce redundancy within a transmission packet in a flow and redundancy across transmission packets in a flow.

Figure 1:
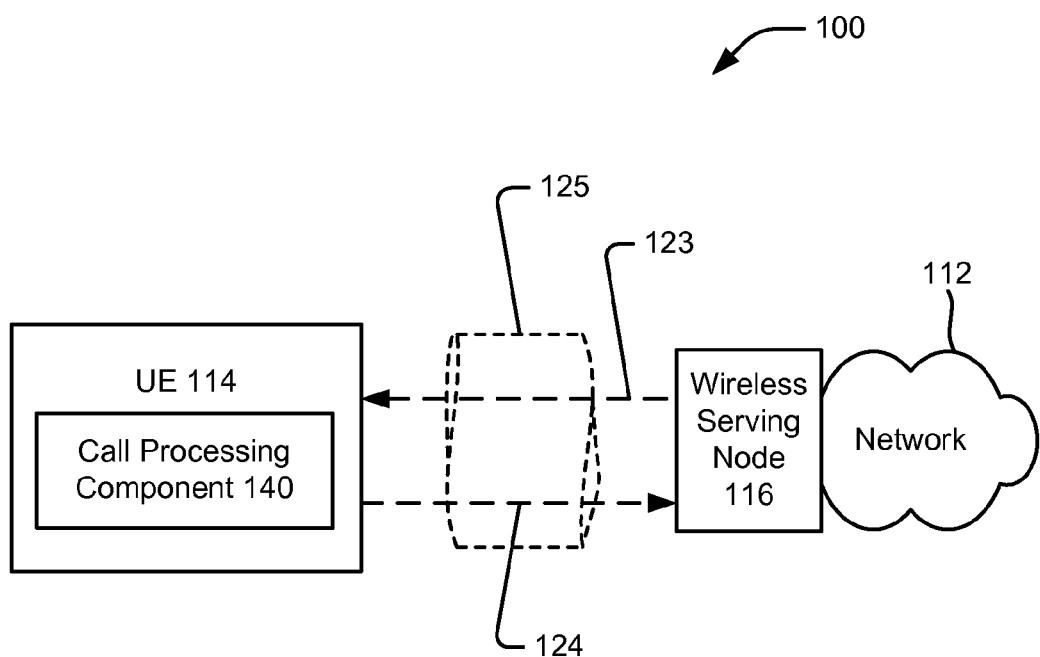
FIG. 1 is a schematic diagram illustrating an example wireless system of aspects of the present disclosure.

Referring to FIG. 1, in one aspect, a wireless communication system 100 is configured to facilitate transmitting vast amount of data from a mobile device to a network at a fast data transfer rate. Wireless communication system 100 includes at least one UE 114 that may communicate wirelessly with one or more network 112 via serving nodes, including, but not limited to, wireless serving node 116 over one or more wireless link 125. The one or more wireless link 125, may include, but are not limited to, signaling radio bearers and/or data radio bearers. Wireless serving node 116 may be configured to transmit one or more signals 123 to UE 114 over the one or more wireless link 125, and/or UE 114 may transmit one or more signals 124 to wireless serving node 116. In an aspect, signal 123 and signal 124 may include, but are not limited to, one or more messages, such as transmitting a data from the UE 114 to network 112 via wireless serving node 116.

UE 114 may comprise a mobile apparatus and may be referred to as such throughout the present disclosure. Such a mobile apparatus or UE 114 may also be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a terminal, a user agent, a mobile client, a client, or some other suitable terminology.

Additionally, the one or more wireless nodes, including, but not limited to, wireless serving node 116 of wireless communication system 100, may include one or more of any type of network component, such as an access point, including a base station or node B, a relay, a peer-to-peer device, an authentication, authorization and accounting (AAA) server, a mobile switching center (MSC), a radio network controller (RNC), etc. In a further aspect, the one or more wireless serving nodes of wireless communication system 100 may include one or more small base stations, such as, but not limited to a femtocell, picocell, microcell, or any other small base station.

Figure 2:
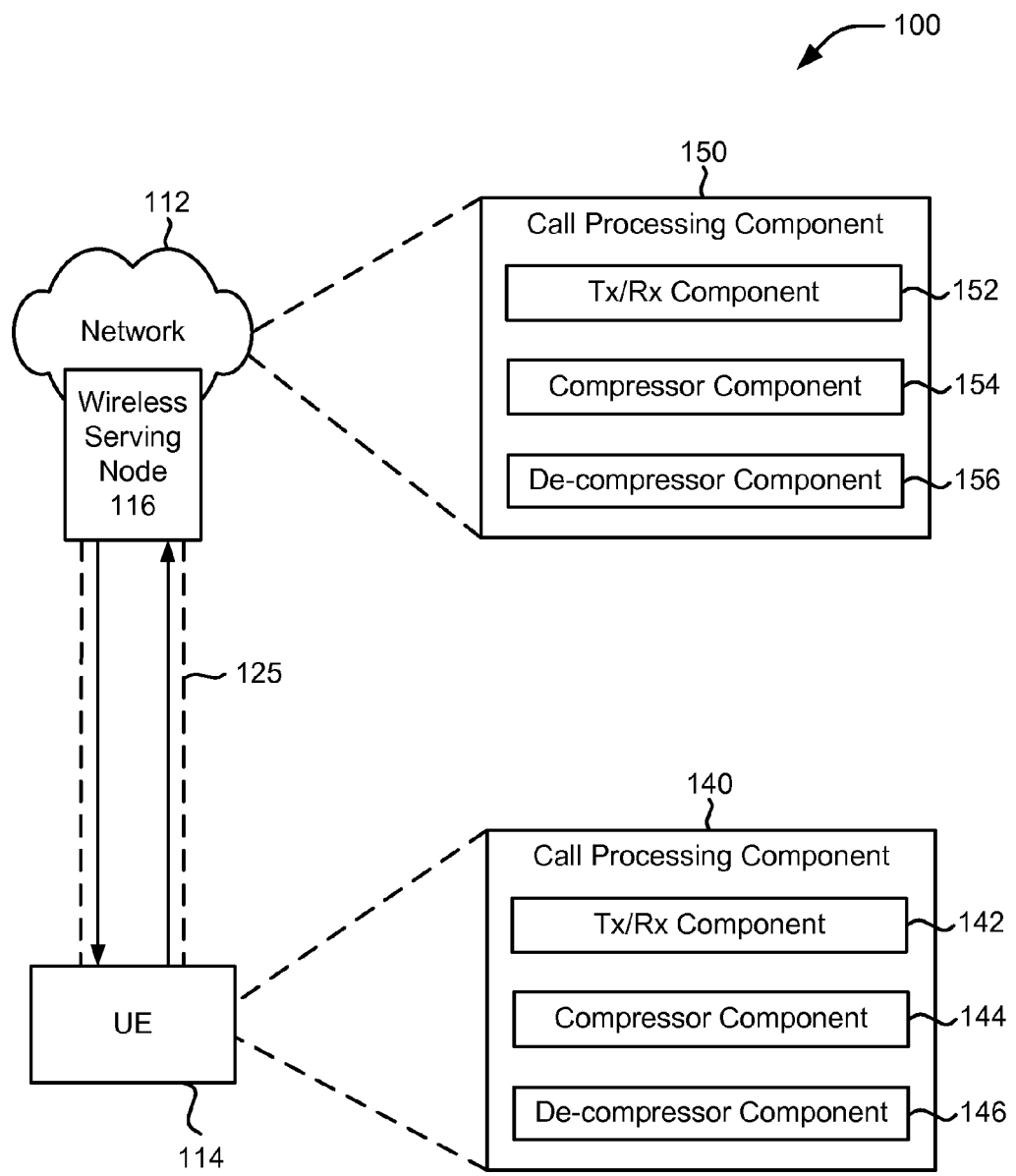
FIG. 2 is a schematic diagram illustrating exemplary aspect of call processing in a wireless communication system.

Referring to FIG. 2, in another aspect of the present apparatus and method, a wireless communication system 100 is configured to include wireless communications between network 112 and user equipment (UE) 114. The wireless communications system may be configured to support communications between a number of users. FIG. 2 illustrates a manner in which network 112 communicates with UE 114. The wireless communication system 100 can be configured for downlink message transmission or uplink message transmission, as represented by the up/down arrows of wireless link 125 between network 112 and UE 114.

In an aspect, within the UE 114 resides a call processing component 140. The call processing component 140 may be configured, among other things, to include a TX/RX component 142 configured to transmit and receive transmission data packets generated at UE 114. For example, UE 114 is configured to receive transmission data packet 210 generated from an operating system/applications of UE 114, as elaborated on in FIG. 2 below. In another aspect, the TX/RX component 142 is configured for transmitting compressed data to network 112 via wireless serving node 116 over link 125 and receiving compressed data from network 112 via wireless serving node 116 over link 125.

The call processing component 140 may also be configured to include a compressor component 144 capable of pattern encoding and entropy encoding. For example, compressor component 144 is configured for compressing the data generated at UE 114 via pattern encoding and entropy encoding which is then transmitted to network 112 via wireless serving node 116 over link 125. The specifics of pattern encoding and entropy encoding are elaborated upon in FIG. 3.

The call processing component 140 may also be configured to also include a de-compressor component 146 capable of pattern decoding and entropy decoding. For example, de-compressor component 146 is configured for pattern decoding and entropy decoding of compressed data received from network 112 via wireless serving node 116 over link 125. Again, the specifics of pattern decoding and entropy decoding are elaborated upon in FIG. 3.

Similarly, in an alternative or additional aspect, the above noted functionally of call processing component 140 may be included in wireless serving node 116 of network 112, as represented by call processing component 150. For example, but not limited hereto, call processing component 150 may be hardware mounted within wireless serving node 116 of network 112, software or computer readable media and/or firmware stored within a memory or processor of network 112, or any combination thereof.

Furthermore, in an aspect, call processing component 150 of network 112 may be configured to include TX/RX component 152 capable of receiving transmission data packet generated from an operating system/applications of network 112, transmitting compressed data to UE 114 via wireless serving node 116 over link 125, and receiving compressed data from UE 114 via wireless serving node 116 over link 125. Still further, call processing component 150 of network 112 may be configured to include compressor component 154 capable of compressing the data generated at network 112 via pattern encoding and entropy encoding which is then transmitted to UE 114 via wireless serving node 116 over link 125. In addition, call processing component 150 of network 112 may be configured to include a de-compressor component 156 capable of pattern decoding and entropy decoding of compressed data received from UE 114 via wireless serving node 116 over link 125. The specifics of pattern encoding/decoding and entropy encoding/decoding are elaborated upon in FIG. 3.

Thus, the present apparatus and methods include a UE-based, and/or network based, call processing component capable of compressing and decompressing received transmission data packets in order to minimize transmission data packet size.

Figure 3:
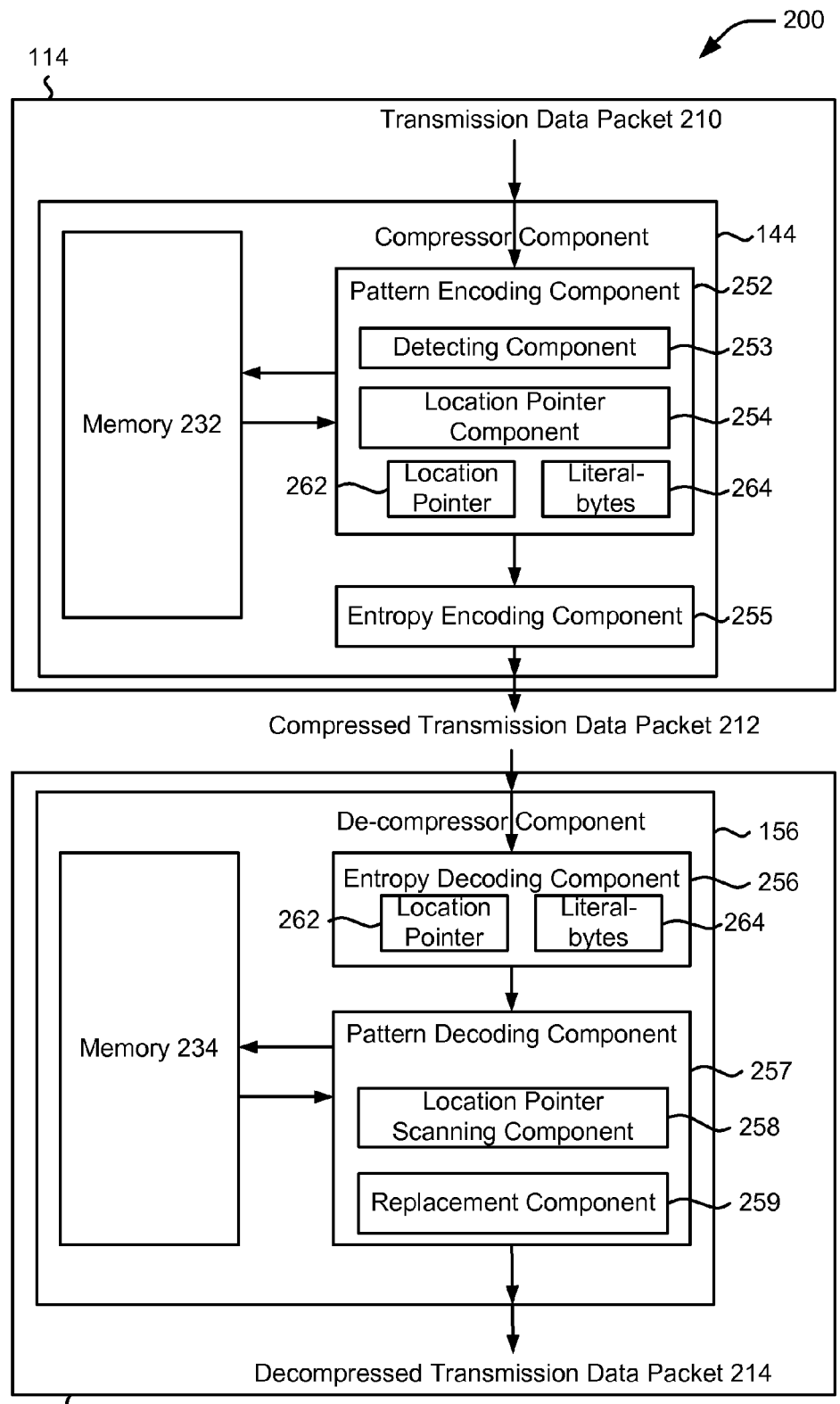
FIG. 3 is a schematic diagram illustrating the functionally and operation of compression and decompression components in a wireless communication system.

FIG. 3 is a schematic diagram 230 further illustrating the functionally and operation of the compressor component 244 and the de-compressor component 246, respectively represented by and equivalent to compressor component 144/154 and de-compressor component 146/156 that reside in call processing component 140/150 of FIG. 2. Generally, call processing component 140 may be configured to transmit a transmission data packet 210 as a compressed transmission data packet 212 from UE 114 to network 112 after being routed through a UE-based compressor component 144. Transmission data packet 210 may be compressed into compressed transmission data packet 212 and transmitted from UE 114 to network 112 over wireless link 125, and may consist of bits, bytes, etc., utilized for transmission.

Once network 112 receives the compressed transmission data packet 212 from UE 114, call processing component 150, is configured to route the compressed transmission data packet 212 through a network-based de-compressor component 156, resulting in decompressed transmission data packet 214. The decompressed transmission data packet 214 may then be utilized by network 112 according to the information located within in the decompressed transmission data packet 214.

It should be noted that the process of compressing and decompressing is represented by the down arrows between UE 114 and network 112 of FIGS. 2 and 3. Note, the direction of transmitting the compressed transmission data packet 212 may be configured to occur from UE 114 to the network 112, as discussed above, and/or from network 112 to UE 114. If the direction of transmitting the compressed transmission data packet 212 occurs from network 112 to UE 114, the components described in FIG. 3 will have corresponding components for compression at network 112, as represented by compressor component 154 (FIG. 2), and decompression at UE 114, as represented by de-compressor component 146 (FIG. 2).

In an aspect, within the compressor component 144 of UE 114 resides a pattern encoding component 252 and a entropy encoding component 255 and a UE-based memory 232. Both the pattern encoding component 252 and the entropy encoding component 255 are capable of encoding transmission data packets transmitted to compressor component 144.

The pattern encoding component 252 may also be configured to also include a detecting component 253 and a location pointer component 254. The detecting component 253 is capable of detecting a string of bytes in the transmission data packet that matches a preset string of bytes saved in a UE-based memory 232. The preset sting of bytes saved are the bytes in memory that may be changed before a data packet is processed. For example, first a memory is initialized to 01020304 in hexadecimal. Second, if packet number 1 containing '0a0b0c0d' (in hexadecimal) is to compressed, the memory after compression of data packet 1 is updated to '010203040a0b0c0d' (where the contents of packet number 1 are pushed in to the memory). This is then repeated for each packet number until the whole of the data packet is compressed and the memory is updated with the correct hexadecimal signature.

In addition, the location pointer component 254 is capable of replacing the string of bytes of the transmission data packet that has been determined to match the preset string of bytes saved in the UE-based memory 232 with location pointer 262. Indeed, the location pointer component 254 may also be configured to replace a selected string of bytes of the transmission data packet, as determined by UE 114 or network 112.

The location pointer 262 specifies the location in the UE-based memory 232 where the preset string of bytes is saved and is referenced for later decompression. Moreover, there may be a plurality of location pointer(s) 262 that match a plurality of preset string of bytes saved in a UE-based memory 232. Last, location pointer 262 may also be configured to include a length indication indicating the number of bytes of the saved preset string of bytes saved in the UE-based memory 232.

In other words, the goal of pattern encoding component 252 is to detect strings of bytes in the current packet being compressed that match bytes preset in the UE-based memory 232. Upon detecting such a match, this particular byte pattern may be replaced by a pointer to the location (location pointer 262) in the UE-based memory 232 that was determined as a match. Basically, pattern encoding component 252 is configured for replacing the string of bytes of the transmission data packet 210 that has been determined to match the preset string of bytes saved in the memory component with a location pointer 262, wherein after replacing the string of bytes in the transmission data packet with the location pointer 262, the transmission data packet 210 comprises the location pointer 262 and a set of literal-bytes 264.

Not only does this operation replace large strings of bytes with fewer ones, the output from pattern encoding then only consists of either a set of literal-bytes 264 (bytes of the transmission packet not replaced by the location pointer) or pointers to locations (location pointer 262) in the UE-based memory 232.

After the transmission data packet is encoded by the pattern encoding component 252, the output from pattern encoding is routed to the entropy encoding component 255. The entropy encoding component 255 is configured for generating a compressed transmission data packet 212 by entropy coding of a set of literal-bytes 264 remaining in the transmission data packet 210 and the location pointer 262.

Entropy encoding encodes bit strings (i.e. sequences of bits) to symbols (e.g., literal-bytes or location pointer) based on the probability of occurrences. Symbols that occur more frequently are provided shorter bit strings and those that occur less frequently are provided longer bit strings, hence reducing the overall size of the data.

Additionally, as discussed above, literal-bytes 264 is defined as the bytes remaining in the transmission data packet 210 after the location pointer component 254 has replaced some of the bytes in the transmission data packet 210 with location pointer 262.

Indeed, entropy encoding component 255 is configured for generating a compressed transmission data packet 212 by entropy coding of a set of literal-bytes 264 remaining in the transmission data packet 210 and the location pointer 262 to generate a compressed transmission data packet 212 with small overall bit length (i.e., a small number of bits). In other words, entropy encoding component 255 is configured for generating a compressed transmission data packet 212 by entropy coding the transmission data packet 210 comprising the set of literal-bytes 264 and the location pointer 262. This allows for the literal-bytes 264 and location pointer 262 to be uniquely recovered from the output bit string.

Generating entropy coding of the set of literal-bytes 264 and location pointer 262 is performed by well known algorithms, such as Huffman Coding and Adaptive Arithmetic Coding. Note, the generation can be based on pre-configured static mapping between the literal-bytes, location pointers and bit strings of the entropy coding. In other words, static mapping is allowed between the symbols and bit strings instead of using Huffman Coding, which may determine the mapping based on the probabilities of occurrence of the symbols (dynamic mapping).

Basically, the goal of entropy coding is to generate a unique prefix-free code for each unique symbol that occurs in an input. The entropy encoders then compresses the data by replacing each fixed-length input symbol with a corresponding variable-length prefix-free output codeword. For example, entropy encoding component 255 generates a unique prefix-free code to both literal-bytes 264 and location pointer 262 and replaces each fixed-length input symbol with a corresponding variable-length prefix-free output codeword to generate a compressed transmission data packet 212 with a small overall bit length.

Once the transmission data packet 210 is compressed by the compressor component 144, the resulting compressed transmission data packet 212 is sent to the de-compressor component 156 of network 112. Similar to compressor component 144, the de-compressor component 156 is configured to include an entropy decoding component 256 and a pattern decoding component 257. Within pattern decoding component 257, there resides a location pointer scanning component 258 and a replacement component 259.

When the de-compressor component 156 receives the compressed transmission data packet 212, the entropy decoding component 256 is configured to decode the entropy coding bit strings in the compressed transmission data packet 212 to generate the set of literal-bytes 264 and location pointer 262. That is to say, the entropy decoding component performs the inverse function of the entropy encoding function.

The set of literal-bytes 264 and the location pointer 262 are then routed to the pattern decoding component 257, where location pointer scanning component 258 scans for location pointer 262 to determine which preset of bytes saved in the network-based memory 234 are to be replaced. The replacement component 259 then replaces the location pointer 262 with the preset string of bytes saved in the network-based memory 234 to generate decompressed transmission data packet 214, which, in all aspects, is identical to transmission data packet 210 before compression. In other words, the pattern decoding component 257 scans for location pointer 262 from the output of the entropy decoding component 256 and replaces location pointer 262 with the preset of bytes saved in the network-based memory 234 referred to by the location pointer 262.

Both the UE-based memory 232 and the network-based memory 234 consist of an amount of memory in which the payloads of the most recent packets in the data flow are stored. In one aspect, after the transmission data packet 210 is compressed at the compressor component 144, the transmission data packet's uncompressed bits are inserted in memory (UE-based memory 232). If there is insufficient space in memory for this operation, the oldest bits are removed to create space.

In another aspect, after the compressed transmission data packet 212 is decompressed at the de-compressor component, the bits of the decompressed transmission data packet 214 are inserted in memory (network-based memory 234). If there is insufficient space in memory for this operation, the oldest bits are removed to create space. Note, both the UE-based memory 232 and the network-based memory 234 may be emptied for synchronization purposes.

Other aspects of this apparatus and methods include performing compression operation only on a certain part of the transmission data packet. For example, when operating on Transmission Control Protocol/Internet Protocol (TCP/IP) packets, only the TCP payload is compressed using the above method, while the header could be compressed using other techniques such as Robust Header Compression (ROHC).

Still other aspects may be configured to allow both the pattern-coding and entropy coding functions at the compressor component 144/154 and the de-compressor component 156/146 to be transparent, in that the compressor component 144/154 and the de-compressor component 156/146 do not perform any functional operation on the input data. This allows for sending the original packet uncompressed, if the overhead associated with compression is not acceptable. In other words, the functions of the compressor component 144/154 and the de-compressor component 156/146 may be rendered inactive when overhead associated with coding compression/decompression becomes unacceptable as defined by UE-based memory 232 or network-based memory 234. Indeed, overhead associated with coding compression/decompression becomes unacceptable when the amount of compression seen varies over time as the traffic pattern may change. For example if the amount of compression gains is not enough to justify the increased processing resources used, the compressor component 144/154 and the de-compressor component 156/146 may be rendered inactive.

Figure 4:
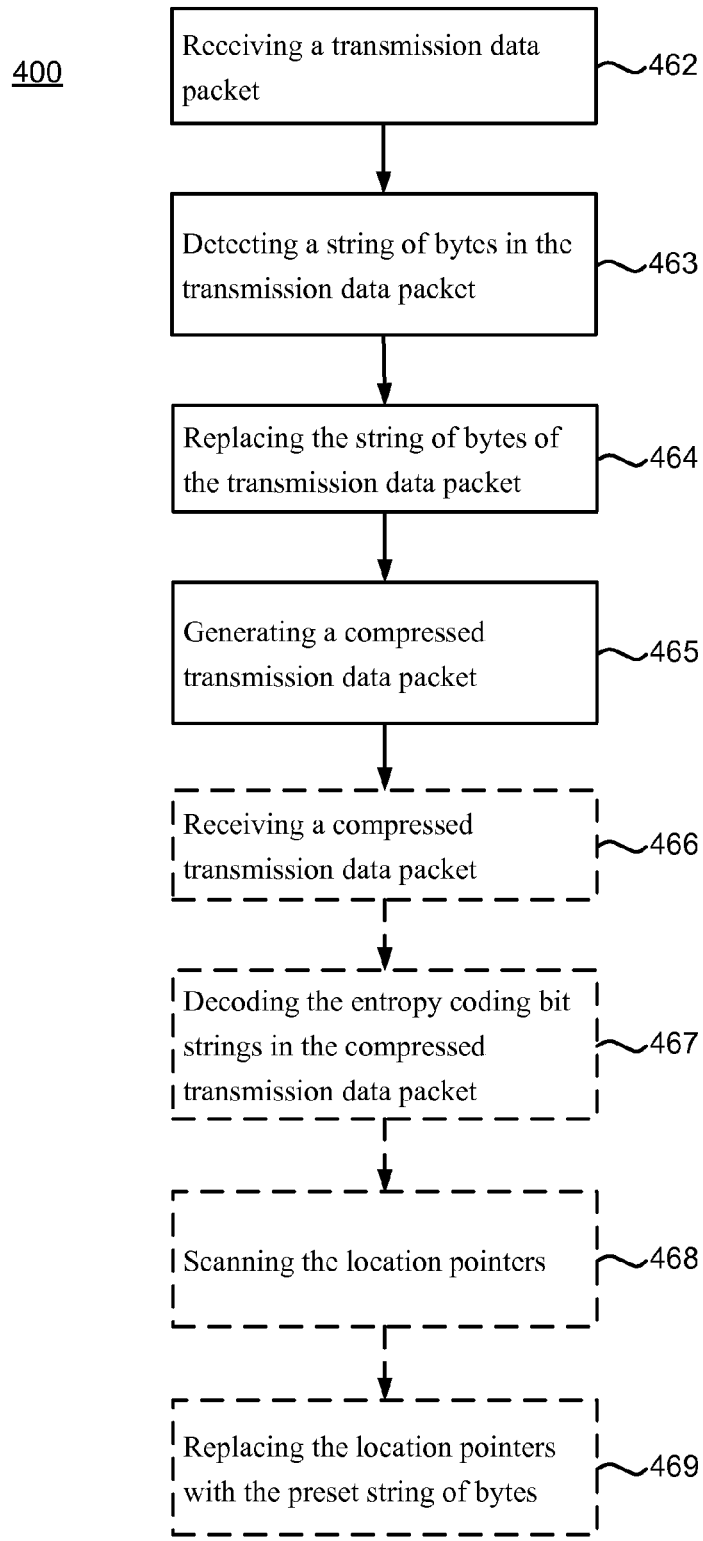
FIG. 4 is a flow diagram illustrating an exemplary method for call processing in a wireless communication system.

FIG. 4 is a flow diagram illustrating an exemplary method 460. It should noted that steps 462-465, illustrated as solid line boxes, represent method steps that occur in UE 114 while steps 466-469, illustrated as dashed line boxes, represent method steps that occur in network 112. Additionally, as discussed above, the method step of FIG. 4 may also be performed in the opposite direction where steps 462-465 are performed on the network side and 466-469 are performed on the UE side.

At 462, the UE receives a transmission data packet. For example, as discussed above with reference to FIG. 2, Tx/Rx component 142 of UE 114 is configured to receive transmission data packet 210. As noted above, transmission data packet 210 may be generated from an operating system and/or applications of UE 114.

At 463, UE 114 attempts to detect if a string of bytes in the transmission data packet matches a preset string of bytes saved in a memory component occurs at 463. For example, as discussed above with reference to FIG. 3, detecting component 253 of pattern encoding component 252, residing in compressor component 144, may be configured to detect a string of bytes in the transmission data packet 210 that matches a preset string of bytes saved in UE-based memory 232.

At 464, UE replaces the string of bytes of the transmission data packet that has been determined to match the preset string of bytes saved in the memory component with a location pointer, wherein after replacing the string of bytes in the data packet with the location pointer, the data packet comprises the location pointer and a set of literal bytes. For example, as discussed above with reference to FIG. 3, location pointer component 254 of pattern encoding component 252, residing in compressor component 144, may be configured to replace a string of bytes of transmission data packet 210 that has been determined to match the preset string of bytes saved in the UE-based memory 232 with location pointer 262, wherein after replacing the string of bytes in the transmission data packet 210 with the location pointer 262, the transmission data packet 210 comprises the location pointer 262 and a set of literal-bytes 264.

It should also be noted that location pointer component 254 may also be configured to replace a string of bytes of transmission data packet 210 that has been determined to match the preset string of bytes saved in the UE-based memory 232 with multiple location pointers.

At 465, the UE generates a compressed transmission data packet by entropy coding the transmission data packet comprising the set of literal-bytes and the location pointer. For example, as discussed above with reference to FIG. 3, entropy encoding component 255, residing in compressor component 144, is configured to generate a compressed transmission data packet 212 by entropy coding the transmission data packet 210 comprising the set of literal-bytes 264 and the location pointer 262.

At, 466, after UE 114 has generated compressed transmission data packet 212 for transmission, network 112 receives the compressed transmission data packet. For example, as discussed with reference to FIG. 2, Tx/Rx component 152 of network 112 is configured to receive compressed transmission data packet 212 from UE 114.

At 467, node B of network 112 decodes the entropy coding bit strings in the compressed transmission data packet to generate the set of literal-bytes and location pointer. For example, as discussed with reference to FIG. 3, entropy decoding component 256, residing in de-compressor component 156, is configured to decode the entropy coding bit strings in the compressed transmission data packet 212 to generate the set of literal-bytes 264 and location pointer 262

At 468, node B of network 112 scans for the location pointers to determine which preset of bytes saved in the memory component are to be replaced at the location pointers occurs. For example, as discussed with reference to FIG. 3, location pointer scanning component 258 of pattern decoding component 257, residing in de-compressor component 156, may scan the received compressed transmission data packet 212 for a location pointer 262 and utilizes the location pointer 262 to identify which preset of bytes saved in the network-based memory 234 are to be replaced.

At 469, node B of network 112 replaces the location pointers with the preset string of bytes saved in the memory component to generate a decompressed transmission data packet. For example, as discussed with reference to FIG. 3, replacement component 259 of pattern decoding component 257, residing in de-compressor component 156, may replace the location pointer 262 with the preset string of bytes saved in the network-based memory 234 to generate decompressed transmission data packet 214.

In an aspect, executing method 460 may be, for example, executed by UE 114/network 112 (FIG. 1) executing the call processing components 140/150 (FIG. 2), or respective components thereof.

Figure 5:
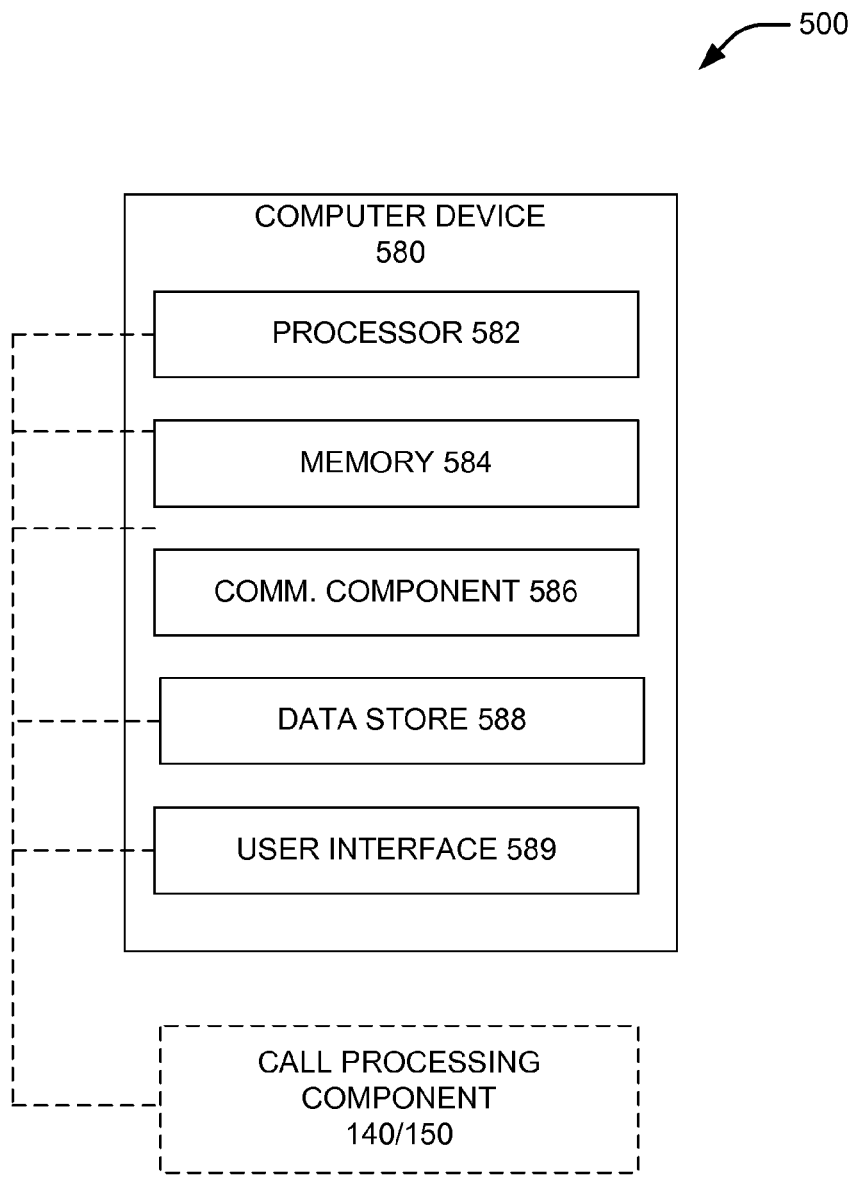
FIG. 5 is a block diagram illustrating additional example components of an aspect of a computer device having a call processing component according to the present disclosure.

Referring to FIG. 5, in one aspect, UE 114 and/or wireless serving node 116 of FIGS. 1 and/or 2 may be represented by a specially programmed or configured computer device 580 of wireless communication system 100, wherein the special programming or configuration includes call processing component 140/150, as described herein. For example, for implementation as UE 114 (FIG. 2), computer device 580 may include one or more components for computing and transmitting a data from a UE 114 to network 112 via wireless serving node 116, such as in specially programmed computer readable instructions or code, firmware, hardware, or some combination thereof. Computer device 580 includes a processor 582 for carrying out processing functions associated with one or more of components and functions described herein. Processor 582 can include a single or multiple set of processors or multi-core processors. Moreover, processor 582 can be implemented as an integrated processing system and/or a distributed processing system.

Computer device 580 further includes a memory 584, such as for storing data used herein and/or local versions of applications being executed by processor 582. Memory 584 can include any type of memory usable by a computer, such as random access memory (RAM), read only memory (ROM), tapes, magnetic discs, optical discs, volatile memory, non-volatile memory, and any combination thereof.

Further, computer device 580 includes a communications component 586 that provides for establishing and maintaining communications with one or more parties utilizing hardware, software, and services as described herein. Communications component 586 may carry communications between components on computer device 580, as well as between computer device 580 and external devices, such as devices located across a communications network and/or devices serially or locally connected to computer device 580. For example, communications component 586 may include one or more buses, and may further include transmit chain components and receive chain components associated with a transmitter and receiver, respectively, or a transceiver, operable for interfacing with external devices. For example, in an aspect, a receiver of communications component 586 operates to receive one or more data via a wireless serving node 116, which may be a part of memory 584.

Additionally, computer device 580 may further include a data store 588, which can be any suitable combination of hardware and/or software, that provides for mass storage of information, databases, and programs employed in connection with aspects described herein. For example, data store 588 may be a data repository for applications not currently being executed by processor 582.

Computer device 580 may additionally include a user interface component 589 operable to receive inputs from a user of computer device 580, and further operable to generate outputs for presentation to the user. User interface component 589 may include one or more input devices, including but not limited to a keyboard, a number pad, a mouse, a touch-sensitive display, a navigation key, a function key, a microphone, a voice recognition component, any other mechanism capable of receiving an input from a user, or any combination thereof. Further, user interface component 589 may include one or more output devices, including but not limited to a display, a speaker, a haptic feedback mechanism, a printer, any other mechanism capable of presenting an output to a user, or any combination thereof.

Furthermore, in an embodiment, the above described processor 582, memory 584, communication component 586, data store 588, and user interface 589 of computer device 580 may be configured to execute call processing component 140/150.

Figure 6:
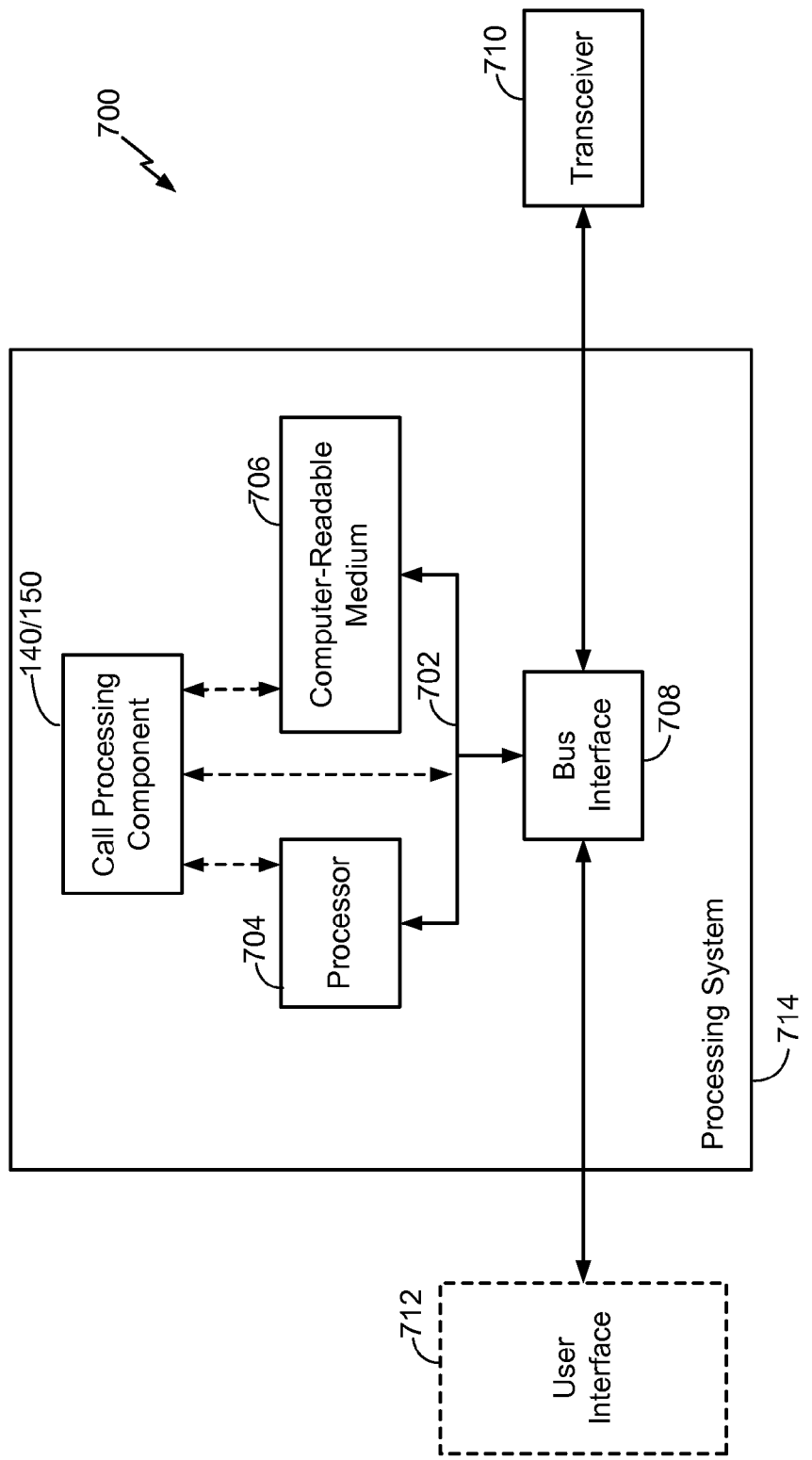
FIG. 6 is a block diagram illustrating an example of a hardware implementation for an apparatus employing a processing system to perform the functions described herein.

FIG. 6 is a block diagram illustrating an example of a hardware implementation for an apparatus 700 employing a processing system 714. Apparatus 700 may be configured to include, for example, wireless communication system 100 (FIG. 2) and/or call processing component 140/150 (FIG. 2) implementing the components described above, such as, but not limited to Tx/Rx component 142/152, compressor component 144/154, and de-compressor component 146/156, as described above. In this example, the processing system 714 may be implemented with a bus architecture, represented generally by the bus 702. The bus 702 may include any number of interconnecting buses and bridges depending on the specific application of the processing system 714 and the overall design constraints. The bus 702 links together various circuits including one or more processors, represented generally by the processor 704, and computer-readable media, represented generally by the computer-readable medium 706. The bus 702 may also link various other circuits such as timing sources, peripherals, voltage regulators, and power management circuits, which are well known in the art, and therefore, will not be described any further. A bus interface 708 provides an interface between the bus 702 and a transceiver 710. The transceiver 710 provides a means for communicating with various other apparatus over a transmission medium. Depending upon the nature of the apparatus, a user interface 712 (e.g., keypad, display, speaker, microphone, joystick) may also be provided.

The processor 704 is responsible for managing the bus 702 and general processing, including the execution of software stored on the computer-readable medium 706. The software, when executed by the processor 704, causes the processing system 714 to perform the various functions described infra for any particular apparatus. The computer-readable medium 706 may also be used for storing data that is manipulated by the processor 704 when executing software.

In an aspect, processor 704, computer-readable medium 706, or a combination of both may be configured or otherwise specially programmed to perform the functionality of the call processing component 140/150 (FIG. 2) as described herein.

The various concepts presented throughout this disclosure may be implemented across a broad variety of telecommunication systems, network architectures, and communication standards.

Figure 7:
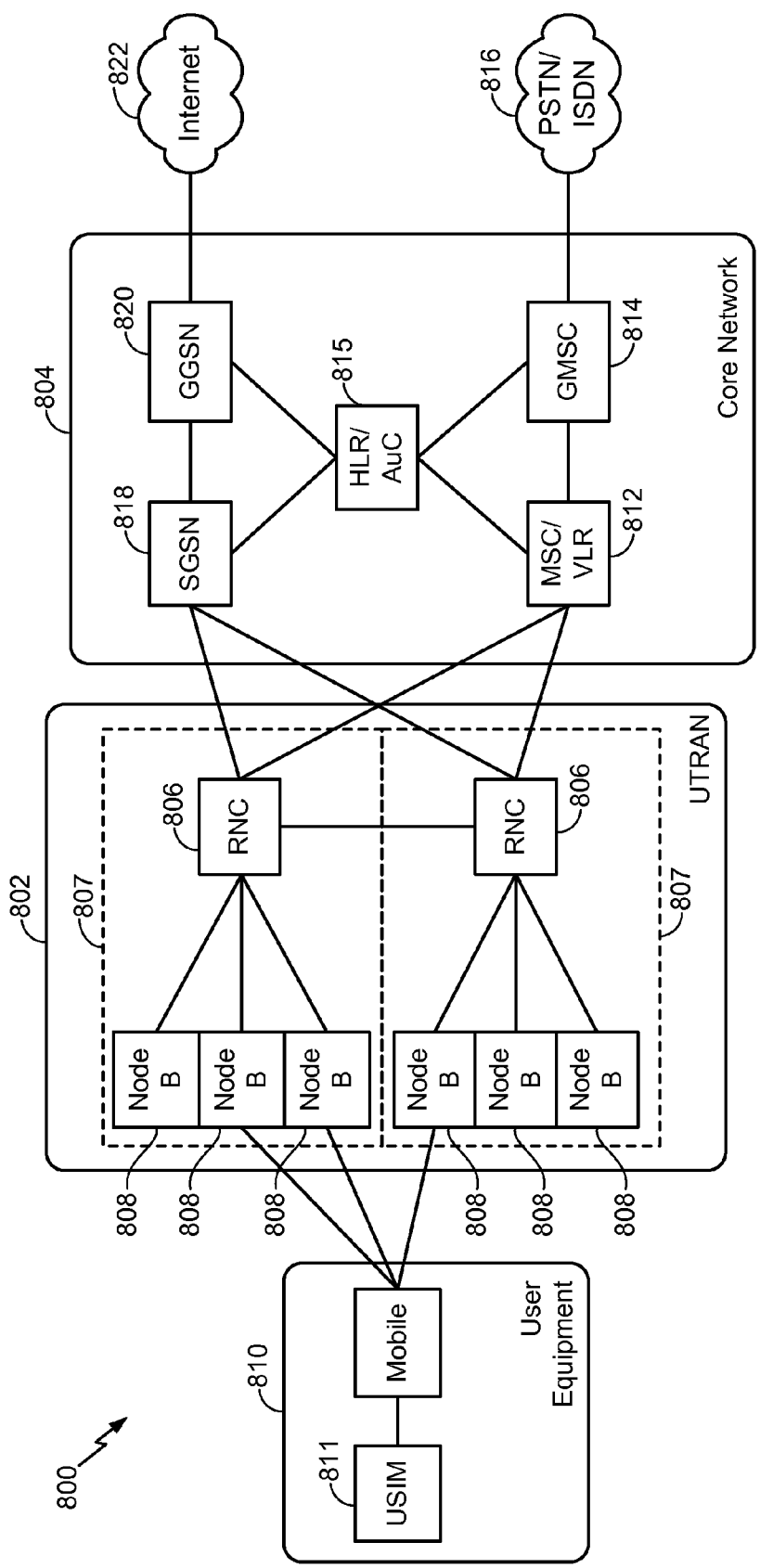
FIG. 7 is a block diagram conceptually illustrating an example of a telecommunications system including a UE configured to perform the functions described herein.

Referring to FIG. 7, by way of example and without limitation, the aspects of the present disclosure are presented with reference to a UMTS system 800 employing a W-CDMA air interface. A UMTS network includes three interacting domains: a Core Network (CN) 804, a UMTS Terrestrial Radio Access Network (UTRAN) 802, and User Equipment (UE) 810. UE 810 may be configured to include, for example, the call processing component 140/150 (FIG. 2) implementing the components described above, such as, but not limited to Tx/Rx component 142/152, compressor component 144/154, and de-compressor component 146/156, as described above. In this example, the UTRAN 802 provides various wireless services including telephony, video, data, messaging, broadcasts, and/or other services. The UTRAN 802 may include a plurality of Radio Network Subsystems (RNSs) such as an RNS 807, each controlled by a respective Radio Network Controller (RNC) such as an RNC 806. Here, the UTRAN 802 may include any number of RNCs 806 and RNSs 807 in addition to the RNCs 806 and RNSs 807 illustrated herein. The RNC 806 is an apparatus responsible for, among other things, assigning, reconfiguring and releasing radio resources within the RNS 807. The RNC 806 may be interconnected to other RNCs (not shown) in the UTRAN 802 through various types of interfaces such as a direct physical connection, a virtual network, or the like, using any suitable transport network.

Communication between a UE 810 and a Node B 808 may be considered as including a physical (PHY) layer and a medium access control (MAC) layer. Further, communication between a UE 810 and an RNC 806 by way of a respective Node B 808 may be considered as including a radio resource control (RRC) layer. In the instant specification, the PHY layer may be considered layer 1; the MAC layer may be considered layer 2; and the RRC layer may be considered layer 3. Information hereinbelow utilizes terminology introduced in the RRC Protocol Specification, 3GPP TS 25.331, incorporated herein by reference.

The geographic region covered by the RNS 807 may be divided into a number of cells, with a radio transceiver apparatus serving each cell. A radio transceiver apparatus is commonly referred to as a Node B in UMTS applications, but may also be referred to by those skilled in the art as a base station (BS), a base transceiver station (BTS), a radio base station, a radio transceiver, a transceiver function, a basic service set (BSS), an extended service set (ESS), an access point (AP), or some other suitable terminology. For clarity, three Node Bs 808 are shown in each RNS 807; however, the RNSs 807 may include any number of wireless Node Bs. The Node Bs 808 provide wireless access points to a CN 804 for any number of mobile apparatuses. Examples of a mobile apparatus include a cellular phone, a smart phone, a session initiation protocol (SIP) phone, a laptop, a notebook, a netbook, a smartbook, a personal digital assistant (PDA), a satellite radio, a global positioning system (GPS) device, a multimedia device, a video device, a digital audio player (e.g., MP3 player), a camera, a game console, or any other similar functioning device. The UE 810 is commonly referred to as a UE in UMTS applications, but may also be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a terminal, a user agent, a mobile client, a client, or some other suitable terminology. In a UMTS system, the UE 810 may further include a universal subscriber identity module (USIM) 811, which contains a user's subscription information to a network. For illustrative purposes, one UE 810 is shown in communication with a number of the Node Bs 808. The DL, also called the forward link, refers to the communication link from a Node B 808 to a UE 810, and the UL, also called the reverse link, refers to the communication link from a UE 810 to a Node B 808.

The CN 804 interfaces with one or more access networks, such as the UTRAN 802. As shown, the CN 804 is a GSM core network. However, as those skilled in the art will recognize, the various concepts presented throughout this disclosure may be implemented in a RAN, or other suitable access network, to provide UEs with access to types of CNs other than GSM networks.

The CN 804 includes a circuit-switched (CS) domain and a packet-switched (PS) domain. Some of the circuit-switched elements are a Mobile services Switching Centre (MSC), a Visitor location register (VLR) and a Gateway MSC. Packet-switched elements include a Serving GPRS Support Node (SGSN) and a Gateway GPRS Support Node (GGSN). Some network elements, like EIR, HLR, VLR and AuC may be shared by both of the circuit-switched and packet-switched domains. In the illustrated example, the CN 804 supports circuit-switched services with a MSC 812 and a GMSC 814. In some applications, the GMSC 814 may be referred to as a media gateway (MGW). One or more RNCs, such as the RNC 806, may be connected to the MSC 812. The MSC 812 is an apparatus that controls call setup, call routing, and UE mobility functions. The MSC 812 also includes a VLR that contains subscriber-related information for the duration that a UE is in the coverage area of the MSC 812. The GMSC 814 provides a gateway through the MSC 812 for the UE to access a circuit-switched network 816. The GMSC 814 includes a home location register (HLR) 815 containing subscriber data, such as the data reflecting the details of the services to which a particular user has subscribed. The HLR is also associated with an authentication center (AuC) that contains subscriber-specific authentication data. When a call is received for a particular UE, the GMSC 814 queries the HLR 815 to determine the UE's location and forwards the call to the particular MSC serving that location.

The CN 804 also supports packet-data services with a serving GPRS support node (SGSN) 818 and a gateway GPRS support node (GGSN) 820. GPRS, which stands for General Packet Radio Service, is designed to provide packet-data services at speeds higher than those available with standard circuit-switched data services. The GGSN 820 provides a connection for the UTRAN 802 to a packet-based network 822. The packet-based network 822 may be the Internet, a private data network, or some other suitable packet-based network. The primary function of the GGSN 820 is to provide the UEs 810 with packet-based network connectivity. Data packets may be transferred between the GGSN 820 and the UEs 810 through the SGSN 818, which performs primarily the same functions in the packet-based domain as the MSC 812 performs in the circuit-switched domain.

An air interface for UMTS may utilize a spread spectrum Direct-Sequence Code Division Multiple Access (DS-CDMA) system. The spread spectrum DS-CDMA spreads user data through multiplication by a sequence of pseudorandom bits called chips. The "wideband" W-CDMA air interface for UMTS is based on such direct sequence spread spectrum technology and additionally calls for a frequency division duplexing (FDD). FDD uses a different carrier frequency for the UL and DL between a Node B 808 and a UE 810. Another air interface for UMTS that utilizes DS-CDMA, and uses time division duplexing (TDD), is the TD-SCDMA air interface. Those skilled in the art will recognize that although various examples described herein may refer to a W-CDMA air interface, the underlying principles may be equally applicable to a TD-SCDMA air interface.

An HSPA air interface includes a series of enhancements to the 3G/W-CDMA air interface, facilitating greater throughput and reduced latency. Among other modifications over prior releases, HSPA utilizes hybrid automatic repeat request (HARQ), shared channel transmission, and adaptive modulation and coding. The standards that define HSPA include HSDPA (high speed downlink packet access) and HSUPA (high speed uplink packet access, also referred to as enhanced uplink, or EUL).

HSDPA utilizes as its transport channel the high-speed downlink shared channel (HS-DSCH). The HS-DSCH is implemented by three physical channels: the high-speed physical downlink shared channel (HS-PDSCH), the high-speed shared control channel (HS-SCCH), and the high-speed dedicated physical control channel (HS-DPCCH).

Among these physical channels, the HS-DPCCH carries the HARQ ACK/NACK signaling on the uplink to indicate whether a corresponding packet transmission was decoded successfully. That is, with respect to the downlink, the UE 810 provides feedback to the node B 808 over the HS-DPCCH to indicate whether it correctly decoded a packet on the downlink.

HS-DPCCH further includes feedback signaling from the UE 810 to assist the node B 808 in taking the right decision in terms of modulation and coding scheme and precoding weight selection, this feedback signaling including the CQI and PCI.

"HSPA Evolved" or HSPA+ is an evolution of the HSPA standard that includes MIMO and 64-QAM, enabling increased throughput and higher performance. That is, in an aspect of the disclosure, the node B 808 and/or the UE 810 may have multiple antennas supporting MIMO technology. The use of MIMO technology enables the node B 808 to exploit the spatial domain to support spatial multiplexing, beamforming, and transmit diversity.

Multiple Input Multiple Output (MIMO) is a term generally used to refer to multi-antenna technology, that is, multiple transmit antennas (multiple inputs to the channel) and multiple receive antennas (multiple outputs from the channel). MIMO systems generally enhance data transmission performance, enabling diversity gains to reduce multipath fading and increase transmission quality, and spatial multiplexing gains to increase data throughput.

Spatial multiplexing may be used to transmit different streams of data simultaneously on the same frequency. The data steams may be transmitted to a single UE 810 to increase the data rate, or to multiple UEs 810 to increase the overall system capacity. This is achieved by spatially precoding each data stream and then transmitting each spatially precoded stream through a different transmit antenna on the downlink. The spatially precoded data streams arrive at the UE(s) 810 with different spatial signatures, which enables each of the UE(s) 810 to recover the one or more the data streams destined for that UE 810. On the uplink, each UE 810 may transmit one or more spatially precoded data streams, which enables the node B 808 to identify the source of each spatially precoded data stream.

Spatial multiplexing may be used when channel conditions are good. When channel conditions are less favorable, beamforming may be used to focus the transmission energy in one or more directions, or to improve transmission based on characteristics of the channel. This may be achieved by spatially precoding a data stream for transmission through multiple antennas. To achieve good coverage at the edges of the cell, a single stream beamforming transmission may be used in combination with transmit diversity.

Generally, for MIMO systems utilizing n transmit antennas, n transport blocks may be transmitted simultaneously over the same carrier utilizing the same channelization code. Note that the different transport blocks sent over the n transmit antennas may have the same or different modulation and coding schemes from one another.

On the other hand, Single Input Multiple Output (SIMO) generally refers to a system utilizing a single transmit antenna (a single input to the channel) and multiple receive antennas (multiple outputs from the channel). Thus, in a SIMO system, a single transport block is sent over the respective carrier.

Figure 8:
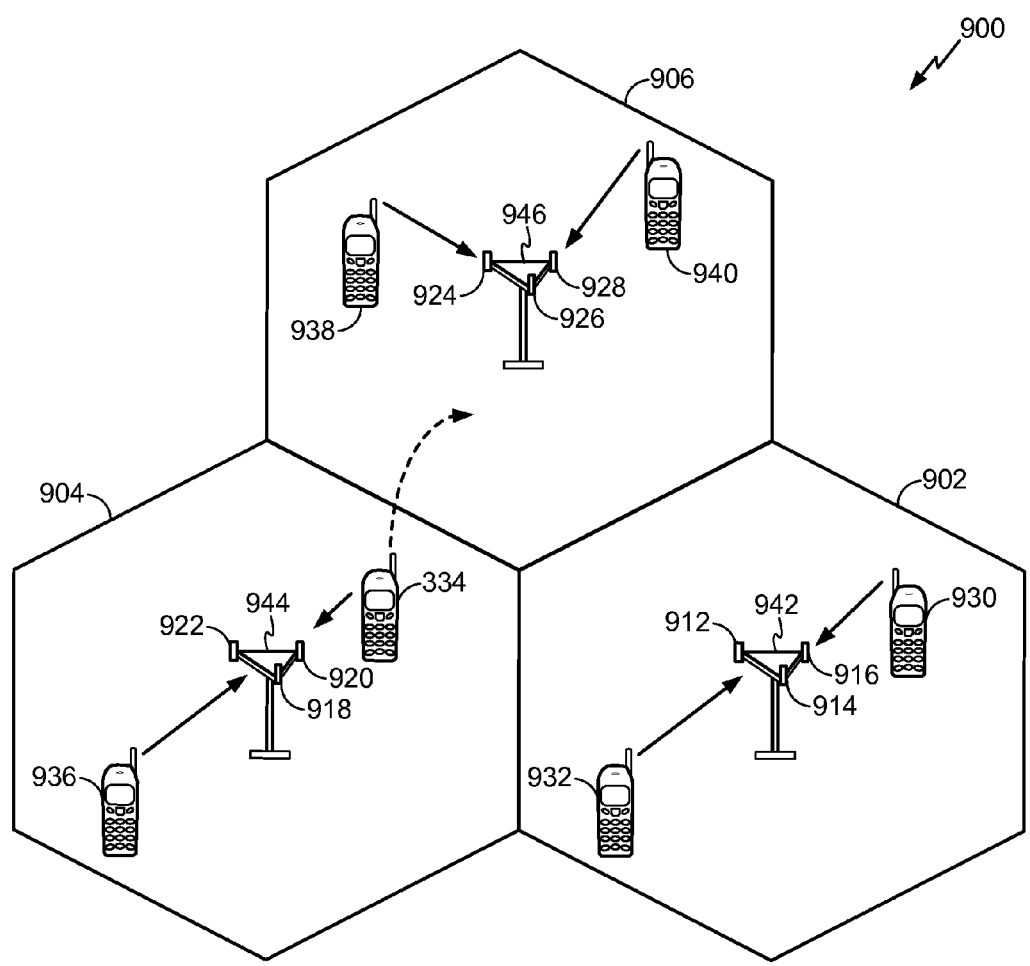
FIG. 8 is a conceptual diagram illustrating an example of an access network for use with a UE configured to perform the functions described herein.

Referring to FIG. 8, an access network 900 in a UTRAN architecture is illustrated. The multiple access wireless communication system includes multiple cellular regions (cells), including cells 902, 904, and 906, each of which may include one or more sectors. The multiple sectors can be formed by groups of antennas with each antenna responsible for communication with UEs in a portion of the cell. For example, in cell 902, antenna groups 912, 914, and 916 may each correspond to a different sector. In cell 904, antenna groups 918, 920, and 922 each correspond to a different sector. In cell 906, antenna groups 924, 926, and 928 each correspond to a different sector. The cells 902, 904 and 906 may include several wireless communication devices, e.g., User Equipment or UEs, which may be in communication with one or more sectors of each cell 902, 904 or 906. For example, UEs 930 and 932 may be in communication with Node B 942, UEs 934 and 936 may be in communication with Node B 944, and UEs 938 and 940 can be in communication with Node B 946. Here, each Node B 942, 944, 946 is configured to provide an access point to a CN 804 (see FIG. 7) for all the UEs 930, 932, 934, 936, 938, 940 in the respective cells 902, 904, and 906. Node Bs 942, 944, 946 and UEs 930, 932, 934, 936, 938, 940 respectively may be configured to include, for example, the call processing component 140/150 (FIG. 2) implementing the components described above, such as, but not limited to Tx/Rx component 142/152, compressor component 144/154, and de-compressor component 146/156, as described above.

As the UE 934 moves from the illustrated location in cell 904 into cell 906, a serving cell change (SCC) or handover may occur in which communication with the UE 934 transitions from the cell 904, which may be referred to as the source cell, to cell 906, which may be referred to as the target cell. Management of the handover procedure may take place at the UE 934, at the Node Bs corresponding to the respective cells, at a radio network controller 806 (see FIG. 7), or at another suitable node in the wireless network. For example, during a call with the source cell 904, or at any other time, the UE 934 may monitor various parameters of the source cell 904 as well as various parameters of neighboring cells such as cells 906 and 902. Further, depending on the quality of these parameters, the UE 934 may maintain communication with one or more of the neighboring cells. During this time, the UE 934 may maintain an Active Set, that is, a list of cells that the UE 934 is simultaneously connected to (i.e., the UTRA cells that are currently assigning a downlink dedicated physical channel DPCH or fractional downlink dedicated physical channel F-DPCH to the UE 934 may constitute the Active Set).

The modulation and multiple access scheme employed by the access network 900 may vary depending on the particular telecommunications standard being deployed. By way of example, the standard may include Evolution-Data Optimized (EV-DO) or Ultra Mobile Broadband (UMB). EV-DO and UMB are air interface standards promulgated by the 3rd Generation Partnership Project 2 (3GPP2) as part of the CDMA2000 family of standards and employs CDMA to provide broadband Internet access to mobile stations. The standard may alternately be Universal Terrestrial Radio Access (UTRA) employing Wideband-CDMA (W-CDMA) and other variants of CDMA, such as TD-SCDMA; Global System for Mobile Communications (GSM) employing TDMA; and Evolved UTRA (E-UTRA), Ultra Mobile Broadband (UMB), and Flash-OFDM employing OFDMA. CDMA2000 and UMB are described in documents from the 3GPP2 organization. The actual wireless communication standard and the multiple access technology employed will depend on the specific application and the overall design constraints imposed on the system.

The radio protocol architecture may take on various forms depending on the particular application. An example for an HSPA system will now be presented with reference to FIG. 9.

Figure 9:
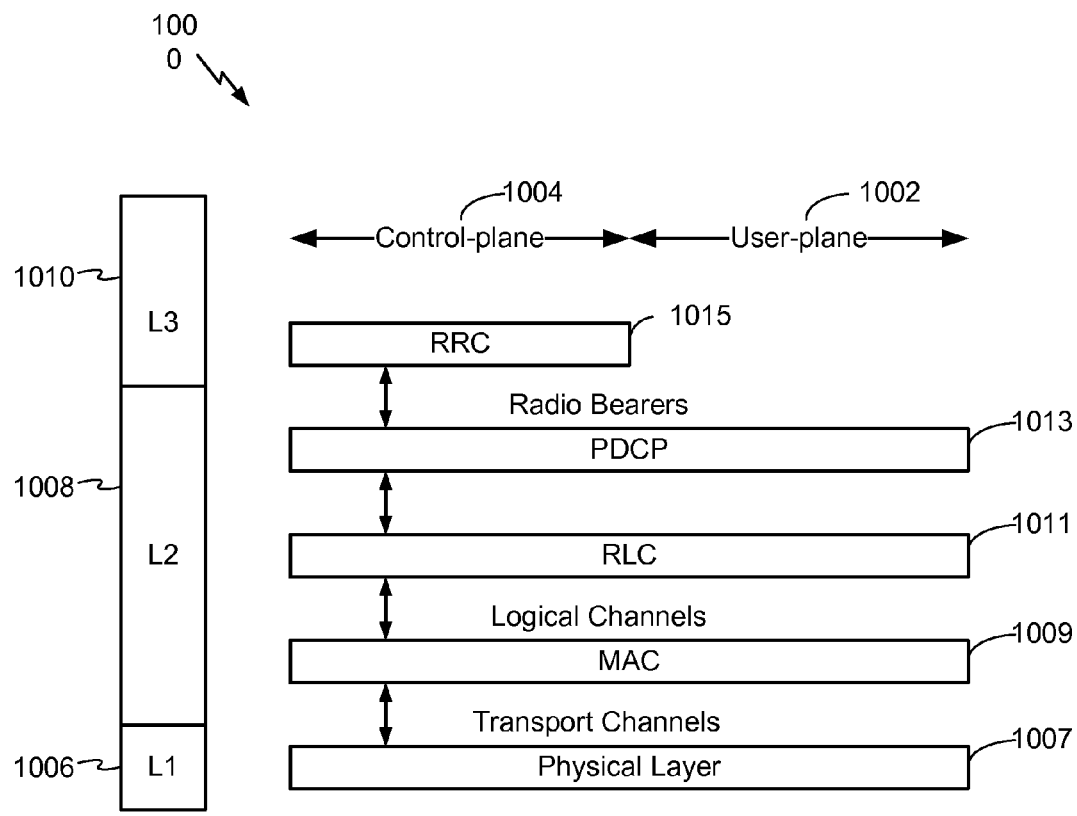
FIG. 9 is a conceptual diagram illustrating an example of a radio protocol architecture for the user and control planes for a base station and/or a UE configured to perform the functions described herein.

FIG. 9 is a conceptual diagram illustrating an example of the radio protocol architecture 1000 for the user plane 1002 and the control plane 1004 of a user equipment (UE) or node B/base station. For example, architecture 1000 may be included in a network entity and/or UE such as an entity within network 112 and/or UE 114 (FIG. 1). The radio protocol architecture 1000 for the UE and node B is shown with three layers: Layer 1 1006, Layer 2 1008, and Layer 3 1010. Layer 1 1006 is the lowest lower and implements various physical layer signal processing functions. As such, Layer 1 1006 includes the physical layer 1007. Layer 2 (L2 layer) 1008 is above the physical layer 1007 and is responsible for the link between the UE and node B over the physical layer 1007. Layer 3 (L3 layer) 1010 includes a radio resource control (RRC) sublayer 1015. The RRC sublayer 1015 handles the control plane signaling of Layer 3 between the UE and the UTRAN.

In the user plane, the L2 layer 1008 includes a media access control (MAC) sublayer 1009, a radio link control (RLC) sublayer 1011, and a packet data convergence protocol (PDCP) 1013 sublayer, which are terminated at the node B on the network side. Although not shown, the UE may have several upper layers above the L2 layer 1008 including a network layer (e.g., IP layer) that is terminated at a PDN gateway on the network side, and an application layer that is terminated at the other end of the connection (e.g., far end UE, server, etc.).

The PDCP sublayer 1013 provides multiplexing between different radio bearers and logical channels. The PDCP sublayer 1013 also provides header compression for upper layer data packets to reduce radio transmission overhead, security by ciphering the data packets, and handover support for UEs between node Bs. The RLC sublayer 1011 provides segmentation and reassembly of upper layer data packets, retransmission of lost data packets, and reordering of data packets to compensate for out-of-order reception due to hybrid automatic repeat request (HARQ). The MAC sublayer 1009 provides multiplexing between logical and transport channels. The MAC sublayer 1009 is also responsible for allocating the various radio resources (e.g., resource blocks) in one cell among the UEs. The MAC sublayer 1009 is also responsible for HARQ operations.

Figure 10:
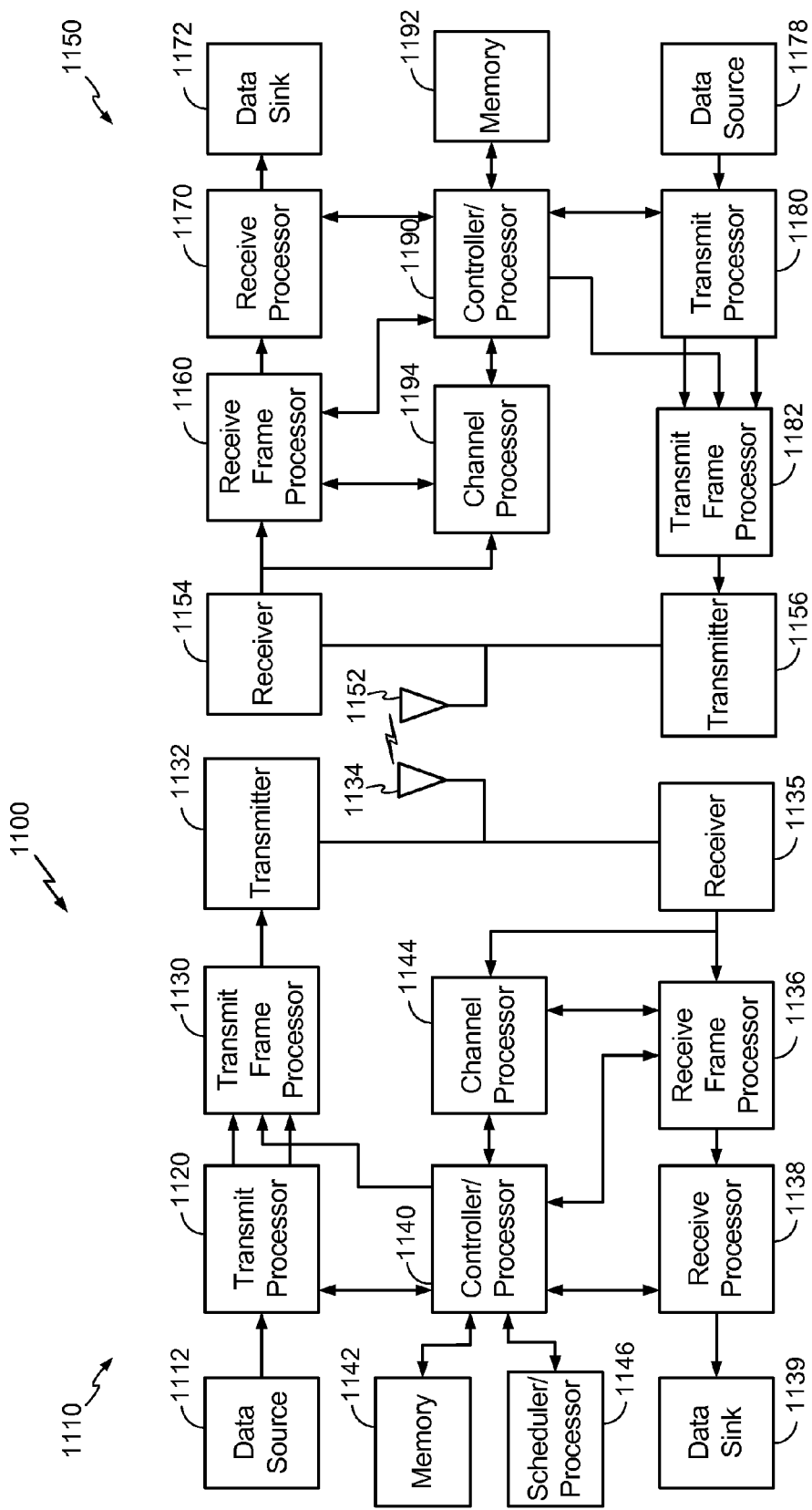
FIG. 10 is a block diagram conceptually illustrating an example of a Node B in communication with a UE in a telecommunications system configured to perform the functions described herein.

FIG. 10 is a block diagram of a communication system 1100 including a Node B 1110 in communication with a UE 1150, where Node B 1110 may be an entity within network 112 and the UE 1150 may be UE 114 according to the aspect described in FIG. 1. UE 1150 and Node B 1110 may be configured to include, for example, the call processing component 140/150 (FIG. 2) implementing the components described above, such as, but not limited to Tx/Rx component 142/152, compressor component 144/154, and de-compressor component 146/156, as described above. In the downlink communication, a transmit processor 1120 may receive data from a data source 1112 and control signals from a controller/processor 1140. The transmit processor 1120 provides various signal processing functions for the data and control signals, as well as reference signals (e.g., pilot signals). For example, the transmit processor 1120 may provide cyclic redundancy check (CRC) codes for error detection, coding and interleaving to facilitate forward error correction (FEC), mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM), and the like), spreading with orthogonal variable spreading factors (OVSF), and multiplying with scrambling codes to produce a series of symbols. Channel estimates from a channel processor 1144 may be used by a controller/processor 1140 to determine the coding, modulation, spreading, and/or scrambling schemes for the transmit processor 1120. These channel estimates may be derived from a reference signal transmitted by the UE 1150 or from feedback from the UE 1150. The symbols generated by the transmit processor 1120 are provided to a transmit frame processor 1130 to create a frame structure. The transmit frame processor 1130 creates this frame structure by multiplexing the symbols with information from the controller/processor 1140, resulting in a series of frames. The frames are then provided to a transmitter 1132, which provides various signal conditioning functions including amplifying, filtering, and modulating the frames onto a carrier for downlink transmission over the wireless medium through antenna 1134. The antenna 1134 may include one or more antennas, for example, including beam steering bidirectional adaptive antenna arrays or other similar beam technologies.

At the UE 1150, a receiver 1154 receives the downlink transmission through an antenna 1152 and processes the transmission to recover the information modulated onto the carrier. The information recovered by the receiver 1154 is provided to a receive frame processor 1160, which parses each frame, and provides information from the frames to a channel processor 1194 and the data, control, and reference signals to a receive processor 1170. The receive processor 1170 then performs the inverse of the processing performed by the transmit processor 1120 in the Node B 1110. More specifically, the receive processor 1170 descrambles and despreads the symbols, and then determines the most likely signal constellation points transmitted by the Node B 1110 based on the modulation scheme. These soft decisions may be based on channel estimates computed by the channel processor 1194. The soft decisions are then decoded and deinterleaved to recover the data, control, and reference signals. The CRC codes are then checked to determine whether the frames were successfully decoded. The data carried by the successfully decoded frames will then be provided to a data sink 1172, which represents applications running in the UE 1150 and/or various user interfaces (e.g., display). Control signals carried by successfully decoded frames will be provided to a controller/processor 1190. When frames are unsuccessfully decoded by the receiver processor 1170, the controller/processor 1190 may also use an acknowledgement (ACK) and/or negative acknowledgement (NACK) protocol to support retransmission requests for those frames.

In the uplink, data from a data source 1178 and control signals from the controller/processor 1190 are provided to a transmit processor 1180. The data source 1178 may represent applications running in the UE 1150 and various user interfaces (e.g., keyboard). Similar to the functionality described in connection with the downlink transmission by the Node B 1110, the transmit processor 1180 provides various signal processing functions including CRC codes, coding and interleaving to facilitate FEC, mapping to signal constellations, spreading with OVSFs, and scrambling to produce a series of symbols. Channel estimates, derived by the channel processor 1194 from a reference signal transmitted by the Node B 1110 or from feedback contained in the midamble transmitted by the Node B 1110, may be used to select the appropriate coding, modulation, spreading, and/or scrambling schemes. The symbols produced by the transmit processor 1180 will be provided to a transmit frame processor 1182 to create a frame structure. The transmit frame processor 1182 creates this frame structure by multiplexing the symbols with information from the controller/processor 1190, resulting in a series of frames. The frames are then provided to a transmitter 1156, which provides various signal conditioning functions including amplification, filtering, and modulating the frames onto a carrier for uplink transmission over the wireless medium through the antenna 1152.

The uplink transmission is processed at the Node B 1110 in a manner similar to that described in connection with the receiver function at the UE 1150. A receiver 1135 receives the uplink transmission through the antenna 1134 and processes the transmission to recover the information modulated onto the carrier. The information recovered by the receiver 1135 is provided to a receive frame processor 1136, which parses each frame, and provides information from the frames to the channel processor 1144 and the data, control, and reference signals to a receive processor 1138. The receive processor 1138 performs the inverse of the processing performed by the transmit processor 1180 in the UE 1150. The data and control signals carried by the successfully decoded frames may then be provided to a data sink 1139 and the controller/processor, respectively. If some of the frames were unsuccessfully decoded by the receive processor, the controller/processor 1140 may also use an acknowledgement (ACK) and/or negative acknowledgement (NACK) protocol to support retransmission requests for those frames.

The controller/processors 1140 and 1190 may be used to direct the operation at the Node B 1110 and the UE 1150, respectively. For example, the controller/processors 1140 and 1190 may provide various functions including timing, peripheral interfaces, voltage regulation, power management, and other control functions. The computer readable media of memories 1142 and 1192 may store data and software for the Node B 1110 and the UE 1150, respectively. A scheduler/processor 1146 at the Node B 1110 may be used to allocate resources to the UEs and schedule downlink and/or uplink transmissions for the UEs.

Several aspects of a telecommunications system have been presented with reference to a W-CDMA system. As those skilled in the art will readily appreciate, various aspects described throughout this disclosure may be extended to other telecommunication systems, network architectures and communication standards.

By way of example, various aspects may be extended to other UMTS systems such as TD-SCDMA, High Speed Downlink Packet Access (HSDPA), High Speed Uplink Packet Access (HSUPA), High Speed Packet Access Plus (HSPA+) and TD-CDMA. Various aspects may also be extended to systems employing Long Term Evolution (LTE) (in FDD, TDD, or both modes), LTE-Advanced (LTE-A) (in FDD, TDD, or both modes), CDMA2000, Evolution-Data Optimized (EV-DO), Ultra Mobile Broadband (UMB), IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

In accordance with various aspects of the disclosure, an element, or any portion of an element, or any combination of elements may be implemented with a "processing system" or processor (FIG. 5 or 6) that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium 706 (FIG. 6). The computer-readable medium 706 (FIG. 6) may be a non-transitory computer-readable medium. A non-transitory computer-readable medium includes, by way of example, a magnetic storage device (e.g., hard disk, floppy disk, magnetic strip), an optical disk (e.g., compact disk (CD), digital versatile disk (DVD)), a smart card, a flash memory device (e.g., card, stick, key drive), random access memory (RAM), read only memory (ROM), programmable ROM (PROM), erasable PROM (EPROM), electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium may be resident in the processing system, external to the processing system, or distributed across multiple entities including the processing system. The computer-readable medium may be embodied in a computer-program product. By way of example, a computer-program product may include a computer-readable medium in packaging materials. Those skilled in the art will recognize how best to implement the described functionality presented throughout this disclosure depending on the particular application and the overall design constraints imposed on the overall system.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A method of telecommunication, comprising:
   receiving a transmission data packet;
   detecting a string of bytes in the transmission data packet that matches a preset string of bytes saved in a memory component;
   replacing the string of bytes of the transmission data packet that has been determined to match the preset string of bytes saved in the memory component with a location pointer, wherein the preset string of bytes corresponds to bytes of one or more previously received and compressed transmission data packets, and wherein after replacing the string of bytes in the transmission data packet with the location pointer, the transmission data packet comprises the location pointer and a set of literal-bytes;
   generating a compressed transmission data packet comprising the set of literal-bytes and the location pointer; and
   storing, in the memory component and after generating the compressed transmission packet, one or more uncompressed bits of the compressed transmission data packet for compression of a subsequent data packet.

2. The method of claim 1, further comprising:
   decoding the compressed transmission data packet to generate the set of literal-bytes and the location pointer;
   scanning for the location pointer to determine which preset of bytes saved in the memory component are to be replaced at the location pointer; and
   replacing the location pointer with the preset string of bytes saved in the memory component to generate the transmission data packet.

3. The method of claim 1, wherein the location pointer indicates a length of the preset string of bytes saved in the memory component and point to a location in the memory component where the preset string of bytes is saved.

4. The method of claim 1, wherein compression encoding of Transmission Control Protocol/Internet Protocol (TCP/IP) packets is performed on a TCP payload.

5. The method of claim 1, wherein replacing the string of bytes of the transmission data packet and generating a compressed transmission data packet is rendered inactive when overhead of the transmission data packet becomes unacceptable as defined by a UE or a network.

6. The method of claim 1, further comprising replacing the string of bytes of the transmission data packet that has been determined to match the preset string of bytes saved in the memory component with a plurality of location pointers.

7. The method of claim 1, wherein generating the compressed transmission data packet comprises entropy encoding the transmission data packet comprising the set of literal-bytes and the location pointer.

8. The method of claim 7, wherein generating a compressed transmission data packet by entropy coding further comprises generating a unique prefix-free code to both literal-bytes and location pointer and replacing each prefix-free code with a corresponding variable-length prefix-free output codeword.

9. The method of claim 7, wherein entropy coding of the set of literal-bytes and the location pointer is performed by Huffman Coding or Adaptive Arithmetic Coding.

10. The method of claim 7, wherein generating a compressed transmission data packet is based on pre-configured static mapping between the set of literal-bytes, the location pointer, and bit strings of the entropy coding.

11. An apparatus of telecommunication, comprising:
at least one processor; and
a memory coupled to the at least one processor, wherein the at least one processor is configured to:
receive a transmission data packet;
detect a string of bytes in the transmission data packet that matches a preset string of bytes saved in a memory component;
replace the string of bytes of the transmission data packet that has been determined to match the preset string of bytes saved in the memory component with a location pointer, wherein the preset string of bytes corresponds to bytes of one or more previously received and compressed transmission data packets, and wherein after replacing the string of bytes in the transmission data packet with the location pointer, the transmission data packet comprises the location pointer and a set of literal-bytes;
generate a compressed transmission data packet comprising the set of literal-bytes and the location pointer; and
store, in the memory component and after generating the compressed transmission packet, one or more uncompressed bits of the compressed transmission data packet for compression of a subsequent data packet.

12. The apparatus of claim 11, wherein the at least one processor configured to:
decode the compressed transmission data packet to generate the set of literal-bytes and the location pointer;
scan for the location pointer to determine which preset of bytes saved in the memory component are to be replaced at the location pointer; and
replace the location pointer with the preset string of bytes saved in the memory component to generate the transmission data packet.

13. The apparatus of claim 11, wherein the location pointer indicates a length of the preset string of bytes saved in the memory component and point to a location in the memory component where the preset string of bytes is saved.

14. The apparatus of claim 11, wherein compression encoding of Transmission Control Protocol/Internet Protocol (TCP/IP) packets is performed on a TCP payload.

15. The apparatus of claim 11, wherein the at least one processor configured to replace the string of bytes of the transmission data packet and generate a compressed transmission data packet is rendered inactive when overhead of the transmission data packet becomes unacceptable as defined by a UE or a network.

16. The apparatus of claim 11, wherein the at least one processor is configured to replace the string of bytes of the transmission data packet that has been determined to match the preset string of bytes saved in the memory component with a plurality of location pointers.

17. The apparatus of claim 11, wherein the at least one processor is configured to generate the compressed transmission data packet at least in part by entropy encoding the transmission data packet comprising the set of literal-bytes and the location pointer.

18. The apparatus of claim 17, wherein the at least one processor configured to generate a compressed transmission data packet by entropy coding is further configured to generate a unique prefix-free code to both literal-bytes and location pointer and replacing each prefix-free code with a corresponding variable-length prefix-free output codeword.

19. The apparatus of claim 17, wherein entropy coding of the set of literal-bytes and the location pointer is performed by Huffman Coding or Adaptive Arithmetic Coding.

20. The apparatus of claim 17, wherein the at least one processor configured to generate a compressed transmission data packet is based on pre-configured static mapping between the set of literal-bytes, the location pointer, and bit strings of the entropy coding.

21. An apparatus of telecommunication, comprising:
means for receiving a transmission data packet;
means for detecting a string of bytes in the transmission data packet that matches a preset string of bytes saved in a memory component;
means for replacing the string of bytes of the transmission data packet that has been determined to match the preset string of bytes saved in the memory component with a location pointer, wherein the preset string of bytes corresponds to bytes of one or more previously received and compressed transmission data packets, and wherein after replacing the string of bytes in the transmission data packet with the location pointer, the transmission data packet comprises the location pointer and a set of literal-bytes;
means for generating a compressed transmission data packet comprising the set of literal-bytes and the location pointer; and
means for storing, in the memory component and after generating the compressed transmission packet, one or more uncompressed bits of the compressed transmission data packet for compression of a subsequent data packet.

22. A non-transitory computer readable medium comprising computer-executable code for:
receiving a transmission data packet;
detecting a string of bytes in the transmission data packet that matches a preset string of bytes saved in a memory component;
replacing the string of bytes of the transmission data packet that has been determined to match the preset string of bytes saved in the memory component with a location pointer, wherein the preset string of bytes corresponds to bytes of one or more previously received and compressed transmission data packets, and wherein after replacing the string of bytes in the transmission data packet with the location pointer, the transmission data packet comprises the location pointer and a set of literal-bytes;
generating a compressed transmission data packet comprising the set of literal-bytes and the location pointer; and
storing, in the memory component and after generating the compressed transmission packet, one or more uncompressed bits of the compressed transmission data packet for compression of a subsequent data packet.

23. A method for telecommunication, comprising:

receiving a compressed transmission data packet;

decoding bit strings in the compressed transmission data packet to generate a set of literal-bytes and location pointers;

scanning the location pointers to determine which preset string of bytes saved in a memory component are to be replaced at the location pointers, wherein the preset string of bytes corresponds to bytes of one or more previously received and decoded transmission data packets;

replacing the location pointers with the preset string of bytes saved in the memory component to generate a transmission data packet; and storing, in the memory component, one or more uncompressed bits of the compressed transmission data packet for decompression of a subsequent data packet.

24. The method of claim 23, wherein the bit strings are entropy coded bit strings in the compressed transmission data packet.

\* \* \* \* \*